United States Patent
Liu et al.

(10) Patent No.: US 7,113,882 B2
(45) Date of Patent: Sep. 26, 2006

(54) AUTOMATIC TESTING SYSTEM

(75) Inventors: Ken-Ho Liu, Miaoli County (TW);
Li-Ping Wang, DongGuan (CN);
Chang-Gen Mao, DongGuan (CN);
Hua-Liang Zhang, DongGuan (CN)

(73) Assignee: Delta Eletronics, Inc., Taoyuan Sien (TW)

( * ) Notice: Subject to any disclaimer, the term of this patent is extended or adjusted under 35 U.S.C. 154(b) by 61 days.

(21) Appl. No.: 10/753,435

(22) Filed: Jan. 9, 2004
(Under 37 CFR 1.47)

(65) Prior Publication Data

US 2004/0181355 A1 Sep. 16, 2004

(30) Foreign Application Priority Data

Jan. 9, 2003 (TW) .............................. 92100395 A

(51) Int. Cl.
*G06F 19/00* (2006.01)

(52) U.S. Cl. .......................... 702/120; 702/64; 702/57; 324/607; 324/511; 340/650; 361/93.9; 361/91.1; 714/724; 714/740

(58) Field of Classification Search ................... 702/57, 702/58, 64, 108, 117, 189, 120; 324/511, 324/607; 340/650, 636.1; 361/93.9, 91, 361/91.1; 714/724, 740

See application file for complete search history.

(56) References Cited

U.S. PATENT DOCUMENTS

| 3,979,477 | A | * | 9/1976 | Schmid et al. ............. 525/438 |
| 4,316,134 | A | * | 2/1982 | Balan et al. .................. 322/99 |
| 4,743,847 | A | * | 5/1988 | Frushour .................... 324/537 |
| 6,441,637 | B1 | * | 8/2002 | Neeb ......................... 324/771 |

OTHER PUBLICATIONS

Lee et al., 'A Microcomputer-Based Testing Station for Dynamic and Static Testing of Protective Relay Systems', Jan. 1995, IEEE Article, pp. 163-168.*

Harada et al., 'A New Vertical IGBT Structure with Monolithic Over Current, Over-Voltage, and Over Temperature Sensing and Protecting Circuit', Sep. 1995, IEEE Publication, vol. 16, No. 9, pp. 399-401.*

* cited by examiner

*Primary Examiner*—Marc S. Hoff
*Assistant Examiner*—Elias Desta
(74) *Attorney, Agent, or Firm*—Birch, Stewart, Kolasch & Birch, LLP

(57) ABSTRACT

An automatic testing system. A sampling and converting device obtains a plurality of electronic parameters from a tested device and transforms them into a plurality of digital signals. A microprocessor receives the digital signals and performs various short-circuit tests, over-current tests and over-voltage tests in a specific sequence.

17 Claims, 6 Drawing Sheets

AUTOMATIC TESTING SYSTEM

This Nonprovisional application claims priority under 35 U.S.C. § 119(a) on Patent Application No(s). 92100395 filed in TAIWAN on Jan. 9, 2003, the entire contents of which are hereby incorporated by reference.

BACKGROUND OF THE INVENTION

1. Field of the Invention

The present invention relates to a testing system, and more particularly to an automatic testing system for a power supply unit.

2. Description of the Related Art

Currently, to test a power supply unit, the following steps are performed. The power supply unit is connected to a power source thereby supplying alternative power, and simulated operational tests, including various short-circuit, over-current, and over-voltage tests are performed. The results are then determined to be correct or not. In the event of test item failure, all of the testing procedures must be repeated, including duplicate keystrokes to confirm each procedure. Thus, the testing method is complicated and error-prone.

Additionally, the testing method requires the power supply unit to be restarted when performing each test, resulting in increased time.

SUMMARY OF THE INVENTION

The object of the present invention is to provide a system for testing a power supply unit automatically, thereby eliminating mistakes generated during the simulated operational tests to increase testing accuracy, eliminating the reduplication of keystrokes, and omitting restarts when performing each test to reduce testing time.

According to the present invention, the automatic testing system comprises a sampling and converting device, an A/D converter, a microprocessor, a programmable input control device, a decoder, a driver and a programmable display control device.

The sampling and converting device obtains a plurality of electronic parameters from a device to be tested, and converts the electronic parameters into a plurality of digital signals. The A/D converter converts the obtained electronic parameters into a plurality of digital signals. The microprocessor receives the digital signals, and performs various short-circuit, over-current, and over-voltage tests in a specific sequence. The programmable input control device receives a plurality of control signals through an input device, and according to each of the control signals, the microprocessor changes the outputs of the device to be tested, so that the sampling and converting device obtains different electronic parameters. The programmable display control device controls a display device according to the testing results of the microprocessor. The decoder analyzes the control signals and transforms the control signals into recognizable signals for the device to be tested. The driver amplifies the analyzed control signals, to change the electronic parameters of the device to be tested. The programmable display control device coupled to the microprocessor displays the results of each test on a display device.

Additionally, the microprocessor comprises at least an Erasable Programmable Read-only Memory (EPROM) for storing a program to perform the power supply unit tests.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

Figure 1:
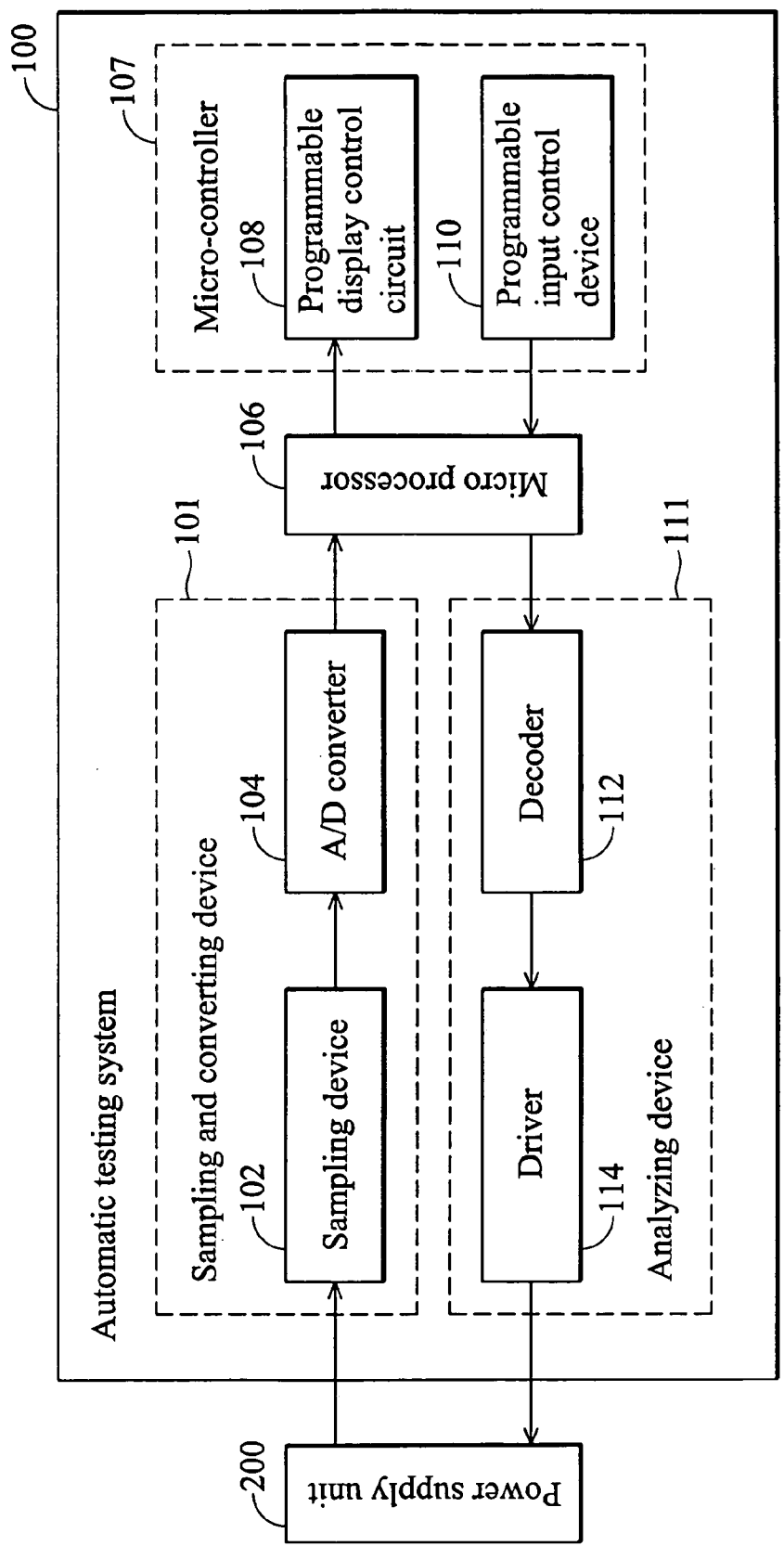
FIG. 1 is a block diagram of an automatic testing system device of the present invention.

FIG. 1 is a block diagram of an automatic testing system device of the present invention, wherein the automatic testing system comprises a sampling and converting device 101, a microprocessor 106, a programmable input control device 110, an analyzing driver 111 and a programmable display control circuit 108. The sampling and converting device 101 obtains a plurality of electronic parameters from a device to be tested, and converts the electronic parameters into a plurality of digital signals, wherein the device to be tested is a power supply unit. The sampling and converting device 101 comprises a sampling device 102 for obtaining the electronic parameters of the power supply unit 200, and an A/D converter 104 for converting the obtained electronic parameters into a plurality of digital signals. The microprocessor 106 receives the digital signals, and performs various short-circuit, over-current and over-voltage tests in a specific sequence. The programmable input control device 110 receives a plurality of control signals though an input device, such as a keyboard, and according to each of the control signals, the microprocessor 106 changes the outputs of the power supply unit 200, so that the sampling and converting device 101 obtains different electronic parameters. The analyzing driver 111 analyzes and transforms the control signals into signals recognizable by the power supply unit 200, to change the electronic parameters of the power supply unit 200.

Additionally, the analyzing driver 111 comprises a decoder 112 for analyzing and transforming the control signals into signals recognizable by power supply unit 200, and a driver 114 for amplifying the analyzed control signals, to change the electronic parameters of the power supply unit 200. The programmable display control circuit 108 coupled to the microprocessor displays the results of each test on a display device.

In this embodiment, the microprocessor 106 requires tests in a specific sequence, for example, after the microprocessor 106 performs the short-circuit tests in the specific sequence, the microprocessor 106 then performs the over-current tests, and subsequently performs the over-current tests in the specific sequence. The microprocessor 106 then performs the over-voltage tests.

Furthermore, the testing system according to the present invention further comprises an Electrically-Erasable Programmable Read-Only Memory (EEPROM) to store a program for performing required tests and by which a testing engineer can program code stored in the EEPROM to control the various tests for the device to be tested.

The programmable display control device 108 and the programmable input control device 110 are used by a same control device or a micro-controller 107.

Figure 2:
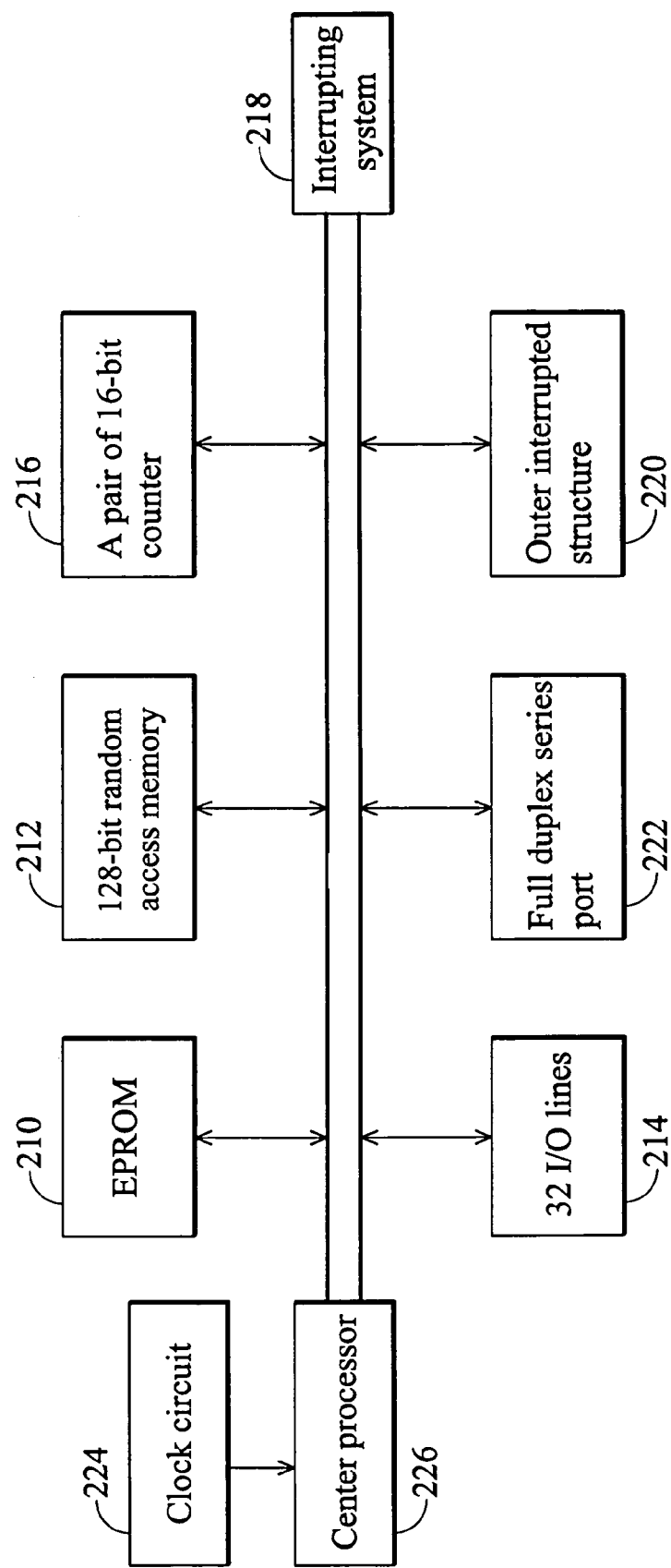
FIG. 2 is a block diagram of a microprocessor of the embodiment.

FIG. 2 is a block diagram of a microprocessor of the embodiment, wherein the microprocessor 106 comprises at least an EPROM according to the invention. The EPROM stores a program, to control testing procedures for different kinds of devices. In this embodiment, the microprocessor 106 given as an example is an Intel AT89C51 chip of the MCS-51 series, which has 4k-bit EPROM 210, 128-bit of random access memory 212, 32 I/O lines 214, a pair of 16-bit counters 216, interrupted system 218, outer interrupted structure 220, full duplex series port 222, clock circuit 224 and center processor 226 working in an zero frequency condition with no static logic. The detailed description of the AT890C51 can be found in the Intel MCS-51 series manual.

Figure 3:
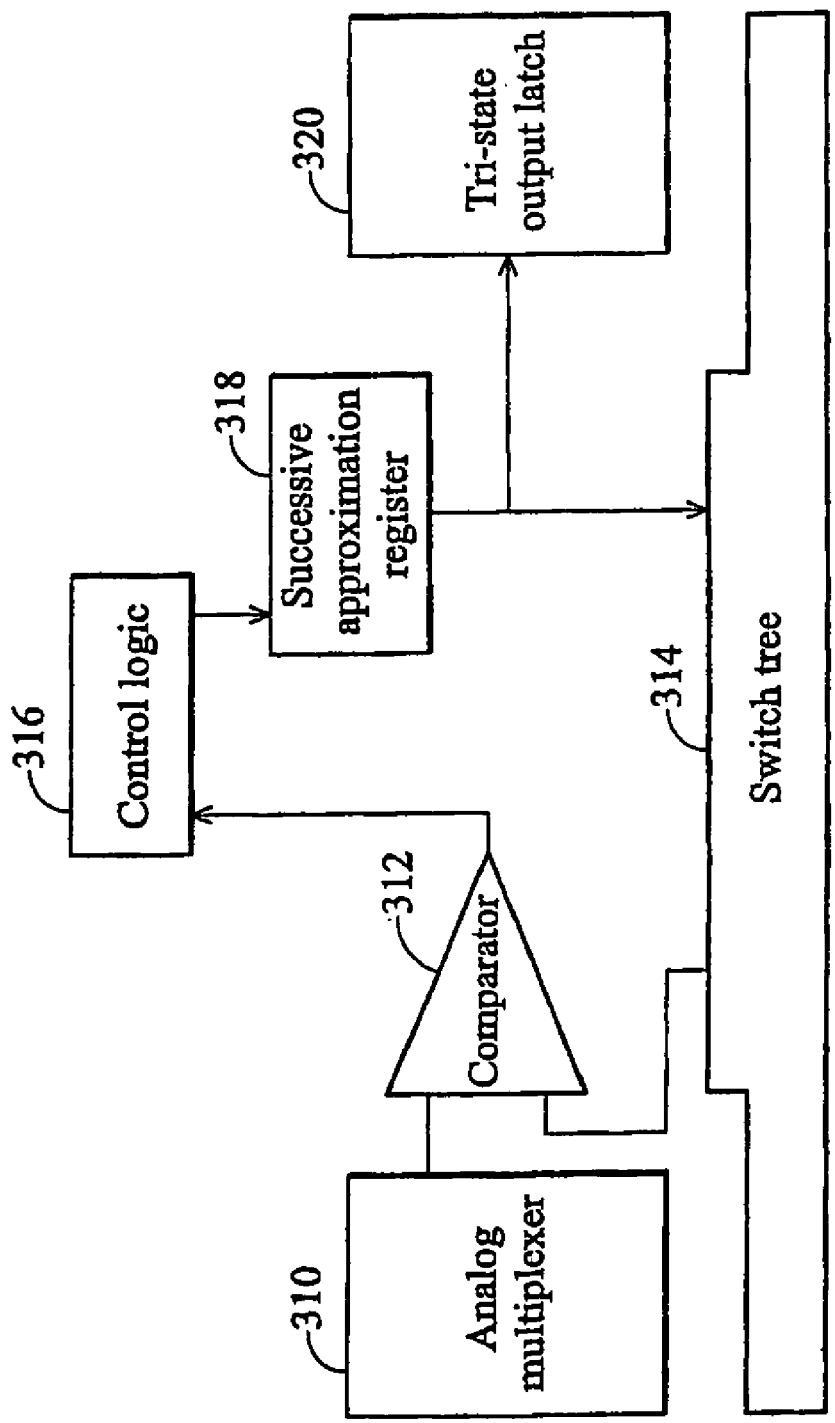
FIG. 3 is a block diagram of an A/D converter of the embodiment.

FIG. 3 is a block diagram of an A/D converter of this embodiment, wherein the A/D converter 104 is taken as a successive approximation ADC0809 chip, which transforms the analog output of the analog multiplexer 310 to an 8-bit digital signal. The output of the analog multiplexer 310 is connected to one of two comparator 312 inputs, and the other input is derived from a 256 resistor ladder, which is tapped by a MOSFET transistor switch tree 314 controlled by a control logic 316. Based on the result of the comparator 312, the control logic 316 and the successive approximation register 318 it is determined whether the next tap to be selected should be higher or lower than the present tap on the resistor ladder. The resulting data of the successive approximation register 318 is loaded into the tri-state output latch 320 with a conversion cycle, to be read by the host system at any time before termination of the next conversion.

Figure 4:
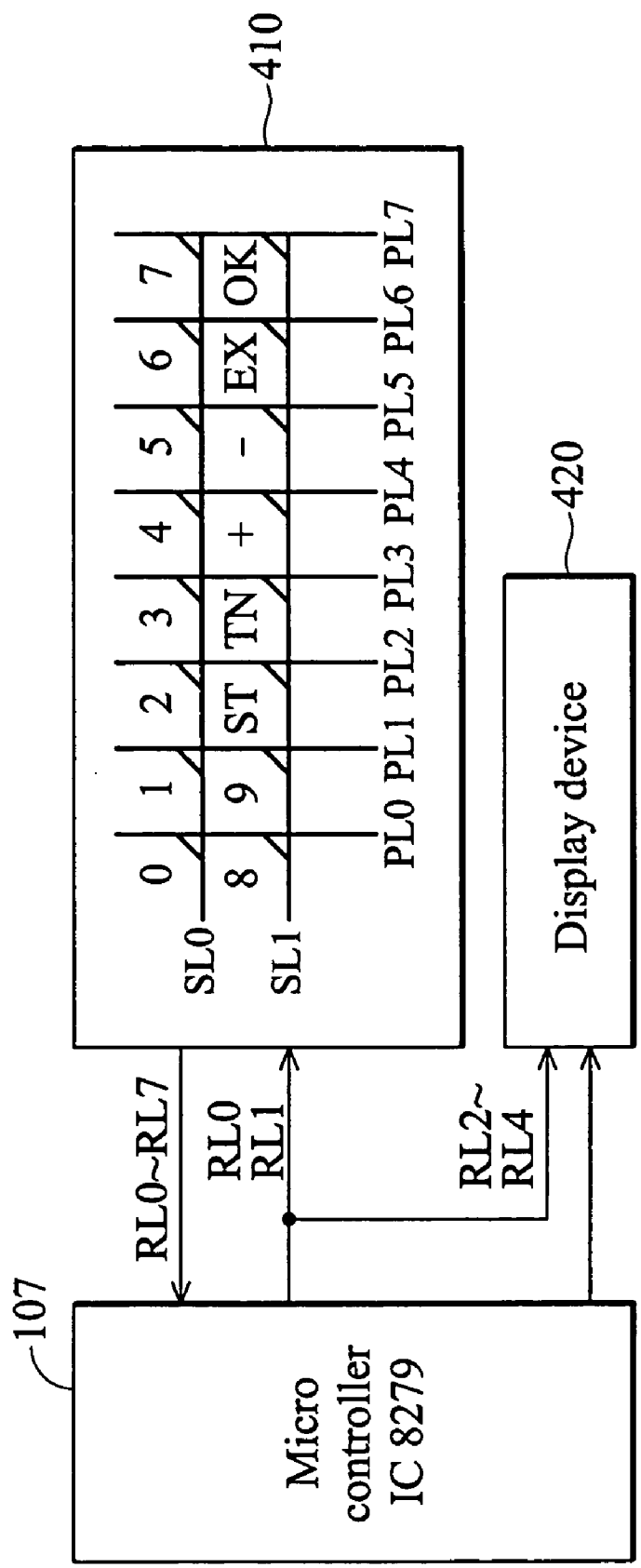
FIG. 4 is a block diagram of a micro-controller connecting two peripherals of the present embodiment.

FIG. 4 is a block diagram of a micro-controller connected to two peripherals of the present embodiment. The programmable display control circuit 108 and the programmable input control device 110 are used by the micro-controller 107 which is an IC8279 chip. The micro-controller 107, rather than the microprocessor 106 provides scan signals SL0~SL4 to control an input device, such as a keyboard 410, and a display device, such as a 5-bit display device 420. The micro-controller 107 controls the keyboard 410 by the scan signals SL0 to SL1, wherein the keyboard 410 comprises a 9 number keys, including one start key (ST), one turning channel key (TN), two auxiliary keys (+/−), one conforming key (OK) and one canceling key (ESC). Thus, the micro-controller 107 can receive input signals form the keyboard 410 through the signal lines RL0 to RL7.

When only the start key (ST) is pressed, the testing procedures can be finished rapidly, and the results are displayed on the display device 420, having 1-bit allocated to display a channel number and 4-bit for displaying the test results.

Figure 5:
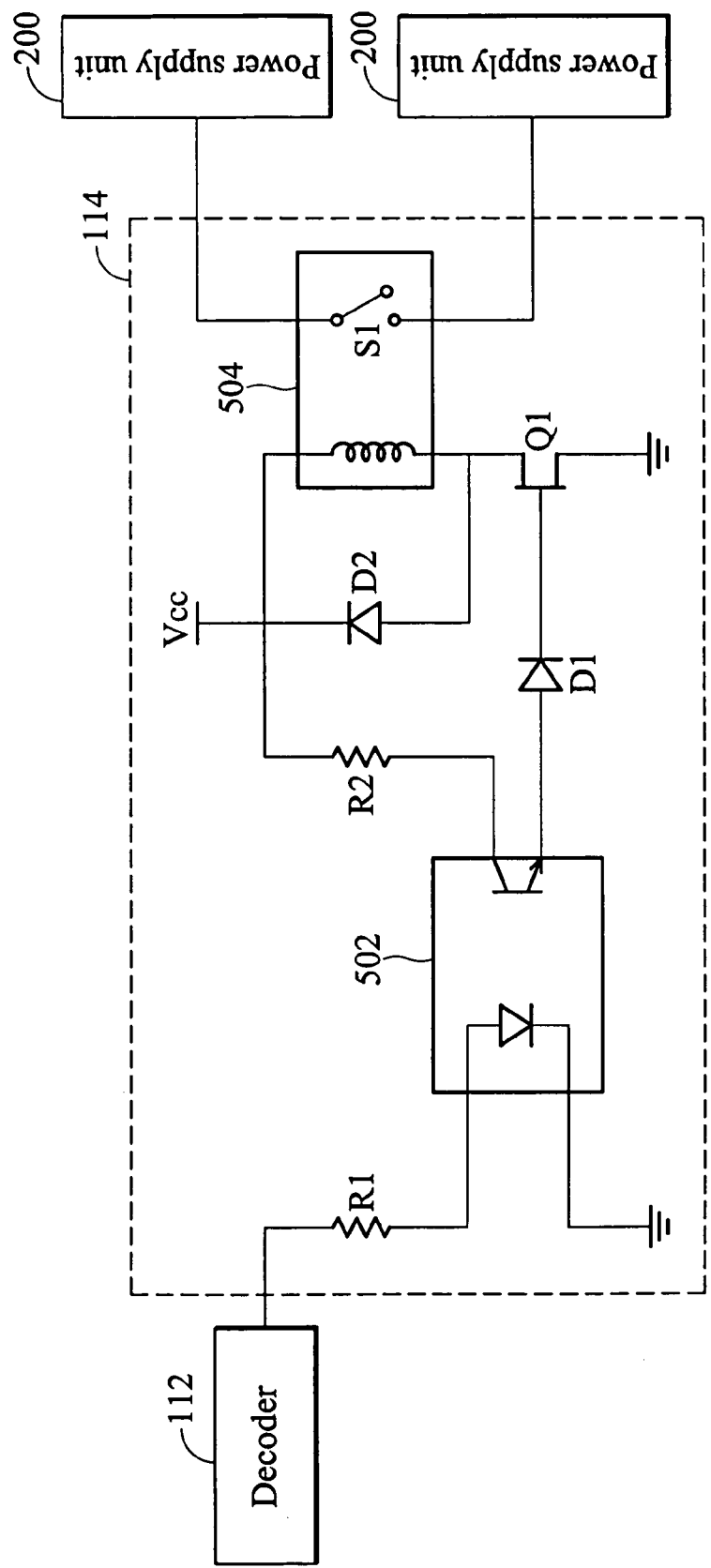
FIG. 5 is a circuit of a driver of the present invention.

FIG. 5 is a circuit of a driver of the present invention. While the control signals of the code translator 112 are too weak to control the power supply unit 200, the control signals are amplified by the driver circuit 114. In FIG. 5, the driver circuit 114 has an opto-coupler 502, resistors R1 and R2, diodes D1 and D2, a transistor Q1 and a relay 504, wherein the opto-coupler 502 isolates the signals of the decoder 112 to prevent the signals from being affected by high frequency noise due to switching of the relay 504. After receiving the signal from the decoder 112 through the resistor R1, the opto-coupler 502 switches on. The current resulting from the voltage source Vcc through the resistor R2 and the diode D1 causes the transistor Q1 to switch on immediate. Hence, the relay 504 is enabled by switching of an inside switch S1 to control the power supply unit 200 according to the amplified signals.

Figure 6:
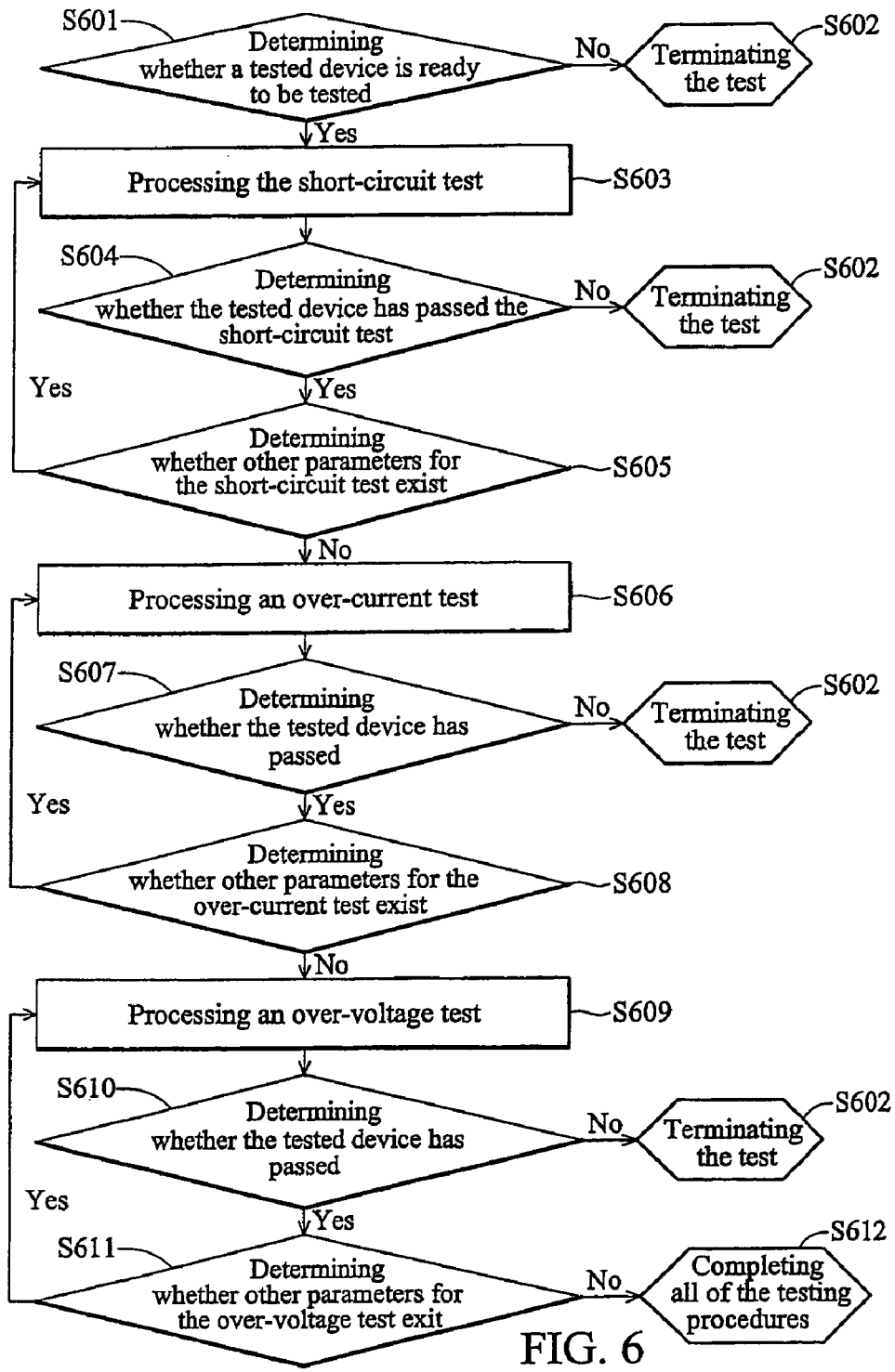
FIG. 6 is a flowchart of an automatic testing method of the present invention.

FIG. 6 is a flowchart of the automatic testing method according to the invention. Step S601 first determines whether a tested device is ready to be tested. If the result of step S601 is negative, step S602 follows and the test is terminated. If the result is positive, step S603 follows and the short-circuit test according to one electronic parameter of the tested device is performed. In step S604, it is determined whether the tested device has passed a specific short-circuit test. If the result of step S604 is negative, step S602 follows and the test is terminated. If the result is positive, step S605 follows and it is determined whether other parameters for the short-circuit test exist. If the result of step S605 is positive, step S603 follows and repeats the short-circuit test procedure. If the result is negative, the short-circuit tests are complete and the over-current tests then begin.

Subsequent to completion of the short-circuit tests, step S606 performs an over-current test according to one electronic parameter of the tested device. In step S607, it is determined whether the tested device has passed the specific over-current test. If the result from step S607 is negative, step S602 follows and the test is terminated. If the result is positive, it is determined whether other parameters exist for over-current testing. If the result of step S608 is positive, step S606 follows and the over-current test is repeated. If the result is negative, the over-current tests are complete and the over-voltage tests begin.

Subsequent to completion of the over-current tests, S609 performs an over-voltage test according to one electronic parameter of the tested device. In step S610, it is determined whether the tested device has passed a specific over-voltage test. If the result from step S610 is negative, step S602 follows and the test is terminate. If the result is positive, step S611 follows and it is determined whether other parameters for an over-current test exist. If the result of the step S608 is positive, step S609 follows and the over-voltage testing procedure is repeated. If the result is negative, the over-voltage tests are completed and step S612 follows completing all the testing procedures.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. An automatic testing system, comprising:
    a sampling and converting device for obtaining a plurality of electronic parameters from a device to be tested, and converting the electronic parameters into a plurality of digital signals;
    a microprocessor coupled to the sampling and converting device for receiving the digital signals, and performing a plurality of different short-circuit tests, a plurality of different over-current tests and a plurality of different over-voltage tests;
    a programmable input control device coupled to the microprocessor for receiving a plurality of control signals by an input device, and according to each of the control signals, the microprocessor changes the outputs of the device to be tested, so that the sampling and converting device obtains different electronic parameters; and an analyzing driver coupled between the microprocessor and the device to be tested for analyzing the control signals to transform the control signals into recognizable signals for the device to be tested, to change the electronic parameters of the device to be tested;

wherein the microprocessor performs the short-circuit tests, the over-current tests and the-over voltage tests in a specific sequence.

2. The automatic testing system as claimed in claim 1, wherein the automatic testing system further comprises:

a programmable display control device coupled to the microprocessor for displaying the results of each short-circuit test, over-current test and over-voltage test on a display device.

3. The automatic testing system as claimed in claim 1 wherein the analyzing driver comprises:

a decoder for analyzing the control signals to transform the control signals into recognizable signals for the device to be tested;and a driver for amplifying the analyzed control signals, to change the electronic parameters of the device to be tested.

4. The automatic testing system as claimed in claim 1, wherein the sampling and converting device comprises:

a sampling device for obtaining the electronic parameters of the device to be tested;and an A/D converter for converting the obtained electronic digital signals.

5. The automatic testing system as claimed in claim 1 wherein the microprocessor comprises at least an Erasable Programmable Read-Only Memory (EPROM) for storing a program to perform the short-circuit tests, the over-current tests and the over-voltage tests.

6. The automatic testing system as claimed in claim 2, wherein the programmable input control device and the programmable display control device are controlled by a same control device.

7. The automatic testing system as claimed in claim 6, wherein the control device is a micro-controller.

8. The automatic testing system as claimed in claim 1, further comprising an Electrically-Erasable Programmable Read-Only Memory (EEPROM) for storing a program in which the microprocessor performs the short-circuit tests, the over-current tests and the over-voltage tests.

9. The automatic testing system as claimed in claim 1, wherein the device to be tested is a power supply unit.

10. The automatic testing system as claimed in claim 1, wherein, after the microprocessor performs the short-circuit tests in the specific sequence, then the microprocessor begins performing the over-current tests; and after the microprocessor performs the over-current tests in the specific sequence, the microprocessor then begins performing the over-voltage tests.

11. The automatic testing system, comparing:

a sampling device for obtaining a plurality of electronic parameters of a device to tested; and an A/D converter coupled to the sampling device for converting the obtained electronic parameters into a plurality of digital signals, a microprocessor coupled to the A/D converter for receiving the digital signals, and respectively performing a plurality of different short-circuit tests, a plurality of different over-current tests and a plurality of different over-voltage tests, based on each of the digital signals;

a programmable input control device coupled to the microprocessor for receiving a plurality of control signals by an input device, and according to each of the control signals, the microprocessor changes the outputs of the device to be tested, so that the sampling and converting device obtains different electronic parameters;

a decoder coupled to the microprocessor for analyzing the control signals to transform the control signals into recognizable signals for the device to be tested;

a driver coupled between the decoder and the device to be tested for amplifying the analyzed control signals, to change the electronic parameters of the device to be tested; and a programmable display control device coupled to the microprocessor for displaying the results of each of the short-circuit tests, the over-current tests and the over-voltage tests on a display device;

wherein the microprocessor performs the short-circuit tests, the over-current tests and the-over voltage tests in a specific sequence.

12. The automatic testing system as claimed in claim 11, wherein the microprocessor comprises at least an Erasable Programmable Read-Only Memory (EPROM) for storing a program to perform the short-circuit tests, the over-current tests and the over-voltage tests.

13. The automatic testing system as claimed in claim 11, further comprising an Electrically-Erasable Programmable Read-Only Memory (EEPROM) for storing a program in which the microprocessor performs the short-circuit tests, the over-current tests and the over-voltage tests.

14. The automatic testing system as claimed in claim 11, wherein the device to be tested is a power supply unit.

15. The automatic testing system as claimed in claim 11, wherein, after the microprocessor performs the short-circuit tests by the specific sequence, then the microprocessor begins performing the over-current tests; and after the microprocessor performs the over-current tests in the specific sequence, the microprocessor then begins performing the over-voltage tests.

16. The automatic testing system as claimed in claim 11, wherein the programmable input control device and the programmable display control device are used by a same control device.

17. The automatic testing system as claimed in claim 16 wherein the control device is a micro-controller.

* * * * *